United States Patent [19]

Lee

[11] Patent Number: 5,668,547
[45] Date of Patent: Sep. 16, 1997

[54] RUNLENGTH CODING METHOD AND APPARATUS FOR USE IN A VIDEO SIGNAL ENCODING SYSTEM

[75] Inventor: Sang-Il Lee, Seoul, Rep. of Korea

[73] Assignee: Daewoo Electronics, Co., Ltd., Seoul, Rep. of Korea

[21] Appl. No.: 565,663

[22] Filed: Dec. 19, 1995

[30] Foreign Application Priority Data

Dec. 19, 1994 [KR] Rep. of Korea ............... 94-34887

[51] Int. Cl.$^6$ .................................................. H03M 7/46
[52] U.S. Cl. ..................... 341/63; 358/261.1; 348/426
[58] Field of Search .......................... 341/63; 348/426; 358/261.1

[56] References Cited

U.S. PATENT DOCUMENTS

| | | | |
|---|---|---|---|
| 4,420,771 | 12/1983 | Pirsch | 341/63 |
| 4,684,923 | 8/1987 | Koga | 341/63 |
| 4,901,075 | 2/1990 | Vogel | 341/63 |
| 5,303,058 | 4/1994 | Fukuda | 358/261.1 |

Primary Examiner—Howard L. Williams
Attorney, Agent, or Firm—Pennie & Edmonds, LLP.

[57] ABSTRACT

A runlength coding apparatus for encoding an input data stream to provide a runlength coded signal comprises a first memory for temporarily storing the zeros and non-zero values included in the input data stream, a run-level detection block for detecting a plurality of run-level pairs from the input data values, each of the run-level pairs including a runlength and a corresponding level, a repetition index detection block for detecting the number of runlengths having an identical value, a buffer control block for generating a first read signal and M number of second read signals based on the runlength repetition index, a second memory connected to the run-level detection means for sequentially storing the level data and for generating the level data stored therein based on the M number of second read signals, a third memory connected to the run-level detection means for sequentially storing the runlength data and for generating the runlength data stored therein based on the first read signal, and a formatting circuit for combining the runlength repetition index, the runlength data and the M number of level data and generating the runlength coded signal.

4 Claims, 1 Drawing Sheet

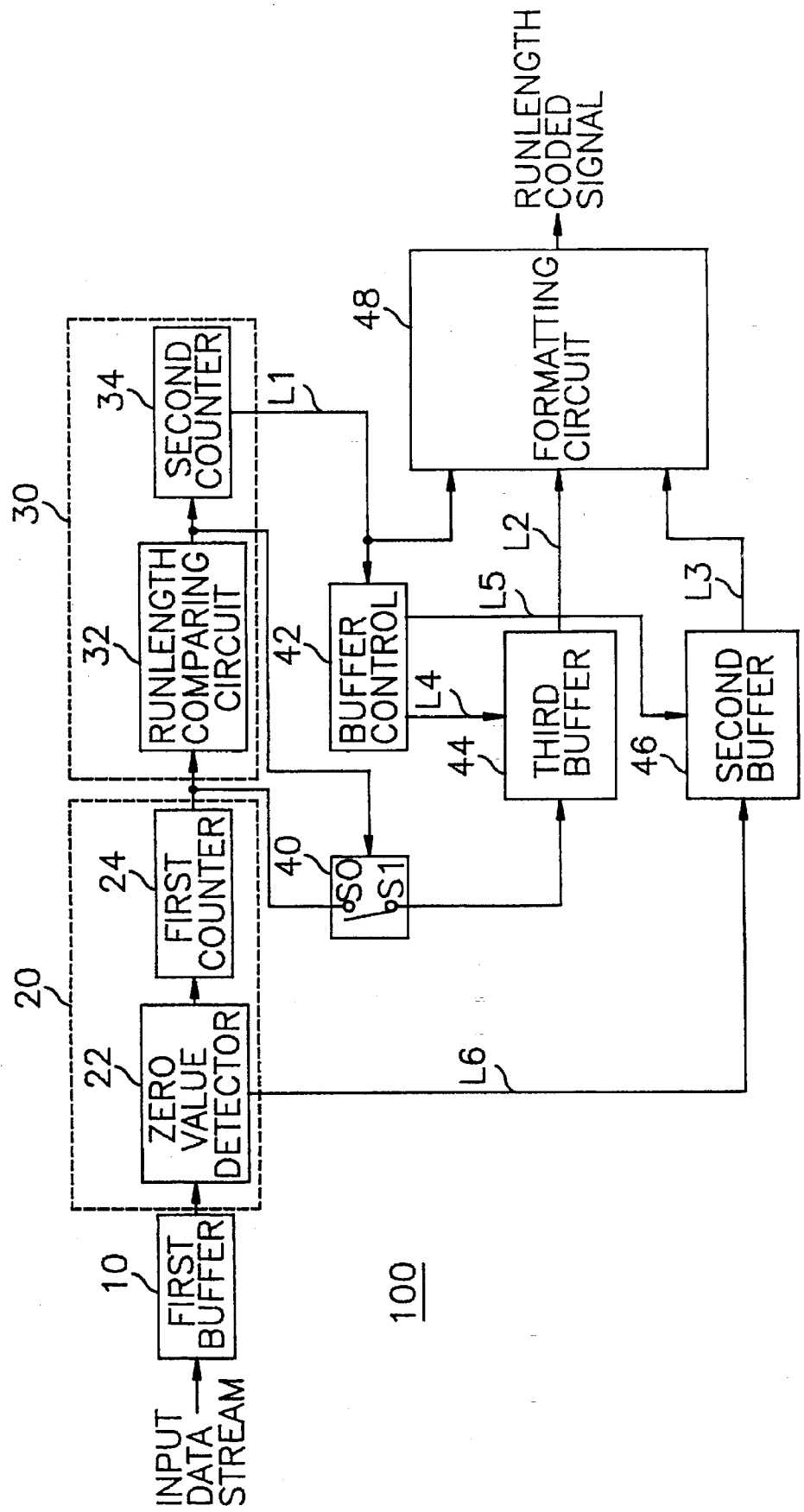

RUNLENGTH CODING METHOD AND APPARATUS FOR USE IN A VIDEO SIGNAL ENCODING SYSTEM

FIELD OF THE INVENTION

The present invention relates to a method and apparatus for encoding a digital video signal; and, more particularly, to an improved runlength coding method and apparatus for use in a video signal encoding system.

DESCRIPTION OF THE PRIOR ART

As is well known, transmission of digitized video signals can attain video images of a much higher quality than the transmission of analog signals. When an image signal is expressed in a digital form, a substantial amount of data is generated for transmission, especially in the case of a high definition television(HDTV) system. Since, however, the available frequency bandwidth of a conventional transmission channel is limited, in order to transmit the substantial amounts of digital data therethrough, it is inevitable to compress or reduce the volume of the transmission data.

In a modern video image transmission or processing system, a digital video signal may be coded by first obtaining the discrete cosine transform(DCT) of a block of pixels. The DCT, which reduces or removes spatial redundancies between frames of image data, converts a block of digital image data, for example, a block of 8×8 pixels, into a set of transform coefficient data. The transform coefficient data are quantized so as to take advantage of the occurrence of "zeros" and then zigzag scanned, thereby generating a stream of image data having a plurality of zeros and non-zero values. Thereafter, the data stream is subjected to a runlength coding to exploit runs of zeros in this data stream.

A conventional apparatus employing the runlength coding converts the data stream into a multiplicity of run-level pairs, each of the run-level pairs including a runlength and a corresponding level, wherein the runlength represents the number of zeros in a run of continuous zeros preceding a non-zero value and the level indicates the magnitude of the non-zero value following the run of continuous zeros.

To further illustrate the point, consider the following stream of image data,

... 0,0,0,7,0,0,0,11,0,0,0,8,0,3,0,0,0, ...

A first portion, comprising three zeros followed by a non-zero value of 7, would be encoded with the runlength of 3 and the level of 7. In a same manner, a second portion comprising three zeros followed by a non-zero value of 11 would be encoded with the runlength of 3 and the level of 11; a third portion comprising three zeros followed by a non-zero value of 8 would be encoded with the runlength of 3 and the level of 8; a fourth portion comprising one zero followed by a non-zero value of 3 would be encoded with the runlength of 1 and the level of 3. Thus, the sequence 0,0,0,7,0,0,0,11,0,0,0,8,0,3 will be encoded as (3,7), (3,11), (3,8), (1,3).

Even though the conventional apparatus may greatly reduce the amount of data to be transmitted by encoding a data stream into run-level pairs, it fails to take advantage of redundancies which may be present in a sequence of run-level pairs, thus leaving room for further reducing the volume of transmission data.

SUMMARY OF THE INVENTION

It is, therefore, a primary object of the invention to provide a runlength coding method and apparatus for use in a video signal encoding system, which is capable of further reducing the volume of transmission data by removing redundancies present in a sequence of run-level pairs obtained through a runlength coding of an input data stream.

In accordance with the present invention, a runlength coding apparatus, for use in a video signal encoding system, for encoding an input data stream of image data to provide a runlength coded signal, wherein the input data stream includes a plurality of zeros and non-zero values, which comprises: a first buffer memory for temporarily storing the zeros and non-zero values included in the input data stream; a run-level detection block for defining a sequence of run-level pairs from the input data stream, wherein each of the run-level pairs includes a runlength and a level, the runlength representing the number of zeros in a run of continuous zeros preceding a non-zero value, and the level indicating the magnitude of the non-zero value following the run of continuous zeros; a repetition index detection block for detecting the number of runlengths having an identical length, and for generating a runlength repetition index representing the number of runlengths, having the identical length, in the sequence; a buffer control block for generating a first read signal and M number of second read signals based on the runlength repetition index, M being an integer identical to the runlength repetition index; a second buffer memory connected to the run-level detection block for sequentially storing and retrieving level data based on the M number of second read signals; a third memory buffer connected to the run-level detection block for sequentially storing and retrieving runlength data based on the first read signal; and a formatting circuit for combining and generating the runlength repetition index, the runlength data and the M number of level data as the runlength coded signal.

BRIEF DESCRIPTION OF THE DRAWINGS

The above and other objects and features of the instant invention will become apparent from the following description of preferred embodiments taken in conjunction with the accompanying drawing, which is a schematic diagram of a runlength coding apparatus in accordance with the present invention.

DETAILED DESCRIPTION OF THE PREFERRED EMBODIMENTS

Referring to the drawing, there is shown a runlength coding apparatus in accordance with a preferred embodiment of the present invention. The runlength coding apparatus 100 encodes a stream of input image data to provide a run length coded signal, wherein the input data stream includes a plurality of zeros and non-zero values.

As shown in the drawing, an input data stream is fed to a first buffer memory 10 for the temporary storage thereof. The stream of input data is sequentially retrieved from the first buffer memory 10 and provided to a run-level detection block 20 which includes a zero value detector 22 and a first counter 24, and serves to construct a sequence of run-level pairs from the input data stream, wherein each of the run-level pairs includes a runlength and a level, the runlength representing the number of zeros in a run of continuous zeros preceding a non-zero value, and the level indicating the magnitude of the non-zero value following the run of continuous zeros.

Specifically, the zero value detector 22 in the run-level detection block 20 generates a first counter control signal with a logic high to the first counter 24 if the element in the input data stream retrieved from the first buffer memory 10 is zero; and if the element in the input data stream retrieved from the first buffer memory 10 is a non-zero value, it provides the non-zero value through a line L6 to a second buffer memory 46 which stores the non-zero input data value as a level, and generates the first counter control signal with a logic low to the first counter 24.

The first counter 24 increments its current counting value by one if the first counter control signal from the zero value detector 22 is a logic high; and, if the first counter control signal is a logic low, then the first counter 24, without incrementing the counting number, provides the current counting value as the runlength to a switching block 40 and a repetition index detection block 30, and is then reset to zero. The repetition index detection block 30 including a runlength comparing circuit 32 and a second counter 34 detects the number of runlengths having an identical length and generates a runlength repetition index representing the number of runlengths having the identical length. More specifically, the runlength comparing circuit 32 compares a runlength newly provided from the first counter 24 in the run-level detection block 20 with a previous runlength stored in a memory thereof, and generates a second counter control signal having a logic high or low to the switching block 40 and the second counter 34. That is, the runlength comparing circuit 32 generates the second counter control signal with the logic high if the new runlength is identical to the previous runlength; otherwise, it updates the memory thereof with the new runlength and generates the second counter control signal with the logic low.

The second counter 34 is substantially identical to the first counter 24 except that the initial current counting value thereof is reset to "1". That is, the second counter 34 increments its current counting value by one if the second counter control signal from the runlength comparing circuit 32 is the logic high; and, if the second counter control signal is the logic low, then the second counter 34 does not increment the counting value and provides the current counting value as the runlength repetition index to a buffer control block 42 and a formatting circuit 48, through a line L1, and is then reset to "1".

In the meantime, the switching block 40, which includes two terminals S0 and S1 coupled to the first counter 24 and a third buffer memory 44, respectively, provides runlength data from the first counter 24 to the third buffer memory 44 in response to a second counter control signal from the runlength comparing circuit 32 in the repetition index detection block 30. That is, if the second counter control signal with a logic high is received, S0 and S1 become open or disconnected, whereas, in case of the second counter control signal being of a logic low, S0 and S1 become connected each other. Therefore, the switching block 40 provides the runlength data from the first counter 24 to the third buffer memory 44 when the second counter control signal is given a logic low.

The buffer control block 42 receives a runlength repetition index from the second counter 34 in the repetition index detection block 30 and generates a first read signal to the third buffer memory 44 via a line L4, and then generates M number of second read signals to the second buffer memory 46 through a line L5, M being an integer identical to the runlength repetition index.

In the preferred embodiment of the invention, the second and third buffer memories 46 and 44 are of a first-in first-out(FIFO) buffer, wherein the input data applied to the FIFO buffers is sequentially stored(or written) into the FIFO buffers and outputted(or read) therefrom in the same manner so as to produce output data which is identical to the input data. The third buffer memory 44 outputs runlength data stored therein to the formatting circuit 48 via a line L2 in response to a first read signal from the buffer control block 42, and the second buffer memory 46 outputs M number of level data stored therein to the formatting circuit 48 through a line L3 in response to M number of second read signals from the buffer control block 42. The formatting circuit 48 combines the runlength repetition index, the runlength data and the M number of level data from the respective lines L1, L2 and L3 and generates a runlength coded signal.

The operation of the runlength coding apparatus may be more readily understood with reference to an example provided below. Assuming that the input data stream inputted to the first buffer memory 10 shown in the drawing consists of the sequence, "$0,1_1,0,1_2,0,1_3,0,1_4,0,1_5,1_6,1_7,0,0,1_8,0,0,1_9,0,0,1_{10},0,0,1_{11}, \ldots$", a first portion of the sequence, "$0,1_1,0,1_2,0,1_3,0,1_4,0,1_5$", which has five run-level pairs, i.e., $(1,1_1)$, $(1,1_2)$, $(1,1_3)$, $(1,1_4)$ and $(1,1_5)$, having an identical runlength "1" and five levels $1_1$, $1_2$, $1_3$, $1_4$ and $1_5$, may be encoded as a combination of the runlength repetition index of 5, the runlength of 1 and the respective level values of $1_1$, $1_2$, $1_3$, $1_4$ and $1_5$. That is, the first portion of the sequence may be encoded as $(5,1,1_1,1_2,1_3,1_4,1_5)$. In a same manner, a second portion of the sequence, "$1_6,1_7$", which has two run-level pairs, i.e., $(0,16)$ and $(0,1_7)$, having the runlength "0" and two levels $1_6$ and $1_7$, may be encoded as $(2,0,1_6,1_7)$; and a third portion of the sequence, "$0,0,1_8,0,0,1_9,0,0,1_{10},0,0,1_{11}$", which has four run-level pairs, i.e., $(2,1_8)$, $(2,1_9)$, $(2,1_{10})$ and $(2,1_{11})$, having an identical runlength "2" and four levels $1_8$, $1_9$, $1_{10}$ and $1_{11}$, may be encoded as $(4,2,1_8,1_9,1_{10},1_{11})$. Consequently, in accordance with the present invention, the above input sequence can be encoded as $(5,1,1_1,1_2,1_3,1_4,1_5)$, $(2,0,1_6,1_7)$, $(4,2,1_8,1_9,1_{10},1_{11})$.

As may be seen from the above, it should be readily appreciated that the runlength coding method and apparatus of the present invention is capable of further reducing the volume of transmission data by removing redundancies present in a sequence of run-level pairs, some of which having identical runlengths.

While the present invention has been shown and described in connection with the preferred embodiments only, it will be readily apparent to those of ordinary skill in the art that many changes and modifications may be made without departing from the spirit and scope of the invention as defined in the appended claims.

What is claimed is:

1. A runlength coding apparatus, for use in a video signal encoding system, for encoding a stream of input data to provide a runlength coded signal, wherein the input data stream includes a plurality of zeros and non-zero values, which comprises:

first memory means for temporarily storing the zeros and the non-zero values included in the input data stream;

run-level detection means for defining a sequence of run-level pairs from the input data stream, wherein each of the run-level pairs includes runlength data and level data, the runlength data representing the number of zeros in a run of continuous zeros preceding a non-zero value, and the level data indicating the magnitude of the non-zero value following the run of continuous zeros;

repetition index detection means for counting the number of runlength data, having an identical value, in the sequence of run-level pairs, and for generating a runlength repetition index representing the number of identical runlength data;

means for generating a first read signal and M number of second read signals based on the runlength repetition index, M being an integer identical to the runlength repetition index;

second memory means connected to the run-level detection means for sequentially storing level data and for generating the level data stored therein based on the M number of second read signals;

third memory means connected to the run-level detection means for sequentially storing runlength data and for generating the runlength data stored therein based on the first read signal; and means for combining the runlength repetition index, the runlength data and the M number of level data to thereby generate the runlength coded signal.

2. The apparatus according to claim 1, wherein the run-level detection means includes:

a zero value detector for generating a first control signal with a logic high if an element in the input data stream supplied thereto is zero; and, otherwise, designating the element in the input data stream as the level data and generating a second control signal with a logic low; and first counting means for incrementing its current counting value by one, in response to the first control signal; and for designating the current counting value as the runlength data, in response to the second control signal.

3. The apparatus according to claim 1, wherein the repetition index detection means includes:

a runlength comparing circuit for comparing runlength data with previous runlength data stored in a memory thereof and generating a third control signal with a logic high if the runlength data is identical to the previous runlength data; and, otherwise, generating a fourth control signal with a logic low; and second counting means for incrementing its current counting value by one, in response to the third control signal, and for generating the current counting value as the runlength repetition index, in response to the fourth control signal.

4. A runlength coding method for encoding a stream of input data to provide a runlength coded signal, wherein the input data stream includes a plurality of zeros and non-zero values, comprising the steps of:

(a) temporarily storing the zeros and the non-zero values included in the input data stream;

(b) defining a sequence of run-level pairs from the input data stream, wherein each of the run-level pairs includes runlength data and level data, the runlength data representing the number of zeros present in a run of continuous zeros preceding a non-zero value, and the level data indicating the magnitude of the non-zero value following the run of the continuous zeros;

(c) counting the number of runlength data, having an identical value, in the sequence of run-level pairs, and generating a runlength repetition index representing the number of identical runlength data;

(d) generating a first read signal and M number of second read signals based on the runlength repetition index, M being an integer identical to the runlength repetition index;

(e) sequentially storing level data and generating the level data stored based on the M number of second read signals;

(f) sequentially storing runlength data and generating the runlength data stored based on the first read signal; and (g) combining the runlength repetition index, the runlength data and the M number of level data to thereby generate the runlength coded signal.

* * * * *